United States Patent
Seshan et al.

(10) Patent No.: US 6,377,457 B1
(45) Date of Patent: Apr. 23, 2002

(54) ELECTRONIC ASSEMBLY AND COOLING THEREOF

(75) Inventors: Krishna Seshan, San Jose; Yves André Volckaert, Mountain View, both of CA (US); Prosenjit Ghosh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/660,859

(22) Filed: Sep. 13, 2000

(51) Int. Cl.⁷ .............................. H05K 7/20
(52) U.S. Cl. ............ 361/690; 361/689; 361/694; 361/695; 361/696; 361/699; 257/714; 174/15.1; 174/16.1; 165/80.2; 165/80.4; 165/104.33; 165/185
(58) Field of Search .................. 361/689, 690, 361/694, 695, 698, 699, 701, 702, 704, 795; 257/714, 715; 174/15.1, 16.1, 16.3; 165/80.2, 80.3, 80.4, 104.33, 177, 180

(56) References Cited

U.S. PATENT DOCUMENTS

| | | | | |
|---|---|---|---|---|
| 4,519,447 A | * | 5/1985 | Wiech, Jr. ............... | 165/104.33 |
| 4,631,636 A | * | 12/1986 | Andrews .................... | 361/699 |
| 4,758,926 A | * | 7/1988 | Herrell et al. .............. | 361/699 |
| 4,809,058 A | * | 2/1989 | Funamoto et al. ............ | 357/82 |
| 4,852,645 A | * | 8/1989 | Coulon et al. .............. | 165/180 |
| 5,313,361 A | * | 5/1994 | Martin ....................... | 361/699 |
| 5,692,558 A | * | 12/1997 | Hamilton et al. .......... | 165/80.4 |
| 5,737,186 A | * | 4/1998 | Fuesser et al. ............. | 361/699 |
| 5,763,951 A | * | 6/1998 | Hamilton et al. ........... | 257/714 |
| 5,870,823 A | * | 2/1999 | Bezama et al. .............. | 29/848 |

* cited by examiner

Primary Examiner—Leo P. Picard
Assistant Examiner—Boris L. Chervinsky
(74) Attorney, Agent, or Firm—Blakely, Sokoloff, Taylor & Zafman LLP

(57) ABSTRACT

An electronic assembly is provided. An electronic substrate of the assembly has a plurality of conductive lines to transmit signals, and a cooling opening therethrough. The cooling opening has an inlet to allow fluid into the electronic substrate, a section in the electronic substrate through which the fluid flows from the inlet, and an outlet from which the fluid flows from the section out of the electronic substrate. A semiconductor die of the assembly is mounted to the electronic substrate. The die has an electronic circuit connected to the metal lines so that signals are transmitted between the electronic circuit and the metal lines, operation of the electronic circuit causing heating of the die, heat being transferred from the die to the electronic substrate from where heat is transferred to the fluid flowing through the section.

20 Claims, 4 Drawing Sheets

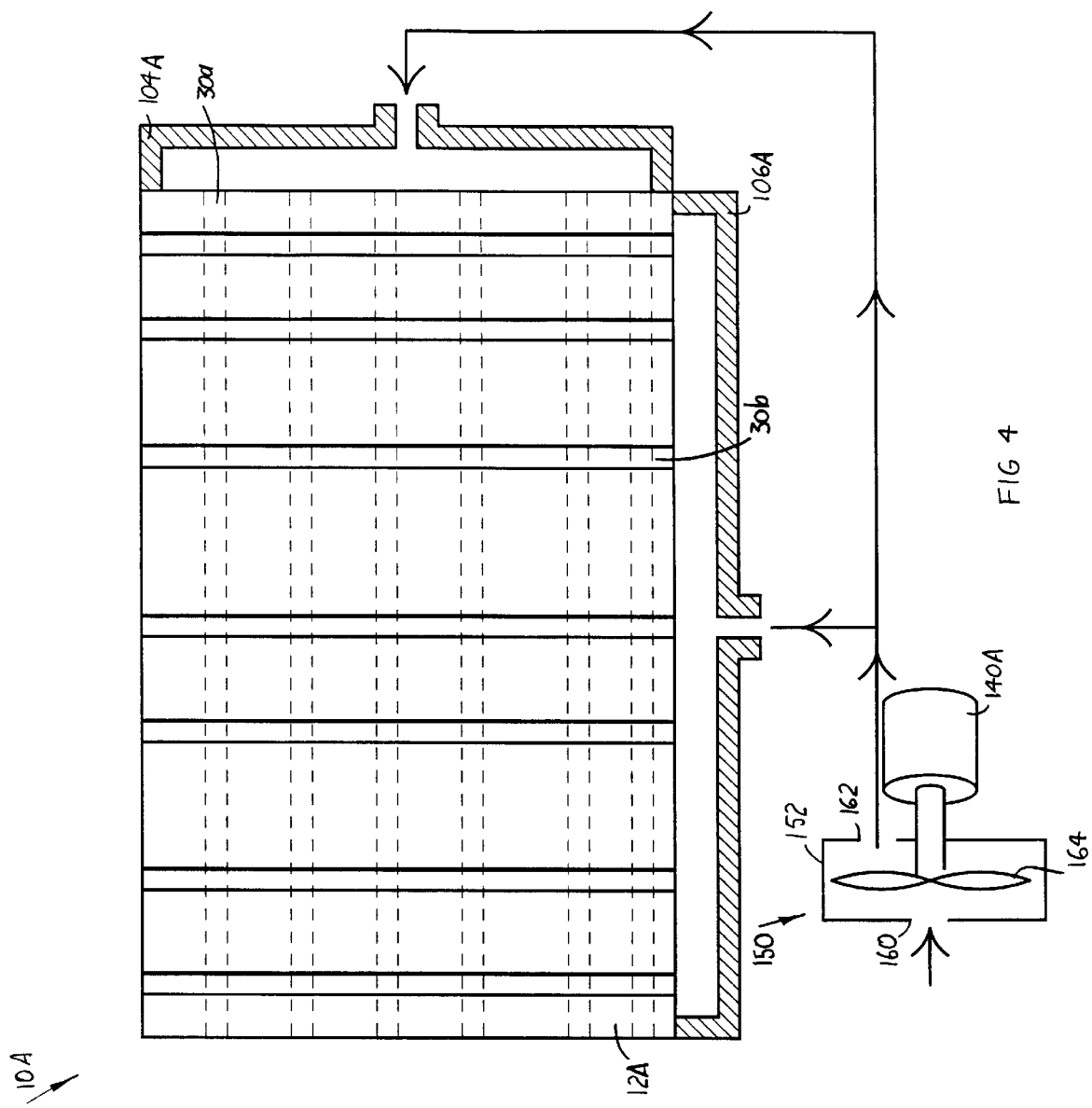

ELECTRONIC ASSEMBLY AND COOLING THEREOF

BACKGROUND OF THE INVENTION

1). Field of the Invention

This invention relates to an electronic assembly and cooling thereof.

2). Discussion of Related Art

Integrated electronic circuits are often formed in semiconductor dies. Such a die is mounted and electrically connected to a package substrate which is then mounted to an electronic substrate such as a motherboard. The package substrate is also electrically connected to the motherboard. Electric signals can be transmitted between metal lines in the motherboard and the electronic circuit so that the electronic circuit is operated.

Operation of the electronic circuit causes heating of the semiconductor die. The electronic circuit may be damaged when the die heats up too much and it may therefore be required to cool the die. The die is typically cooled by mounting a heat sink to the die. Heat can then be transferred from the die to the heat sink and be convected from fins of the heat sink. Alternatively, a fan may be mounted over the die and the fan may blow air onto the die so as to cool the die. A heat sink or a fan increases transfer of heat from a surface of the die opposing the package substrate and the motherboard.

BRIEF DESCRIPTION OF THE DRAWINGS

The invention is further described by way of examples with reference to the accompanying drawings wherein:

FIG. 4 is a cross-sectional plan view similar to FIG. 3 of an electronic assembly according to another embodiment of the invention.

DETAILED DESCRIPTION OF THE INVENTION

Figure 1:
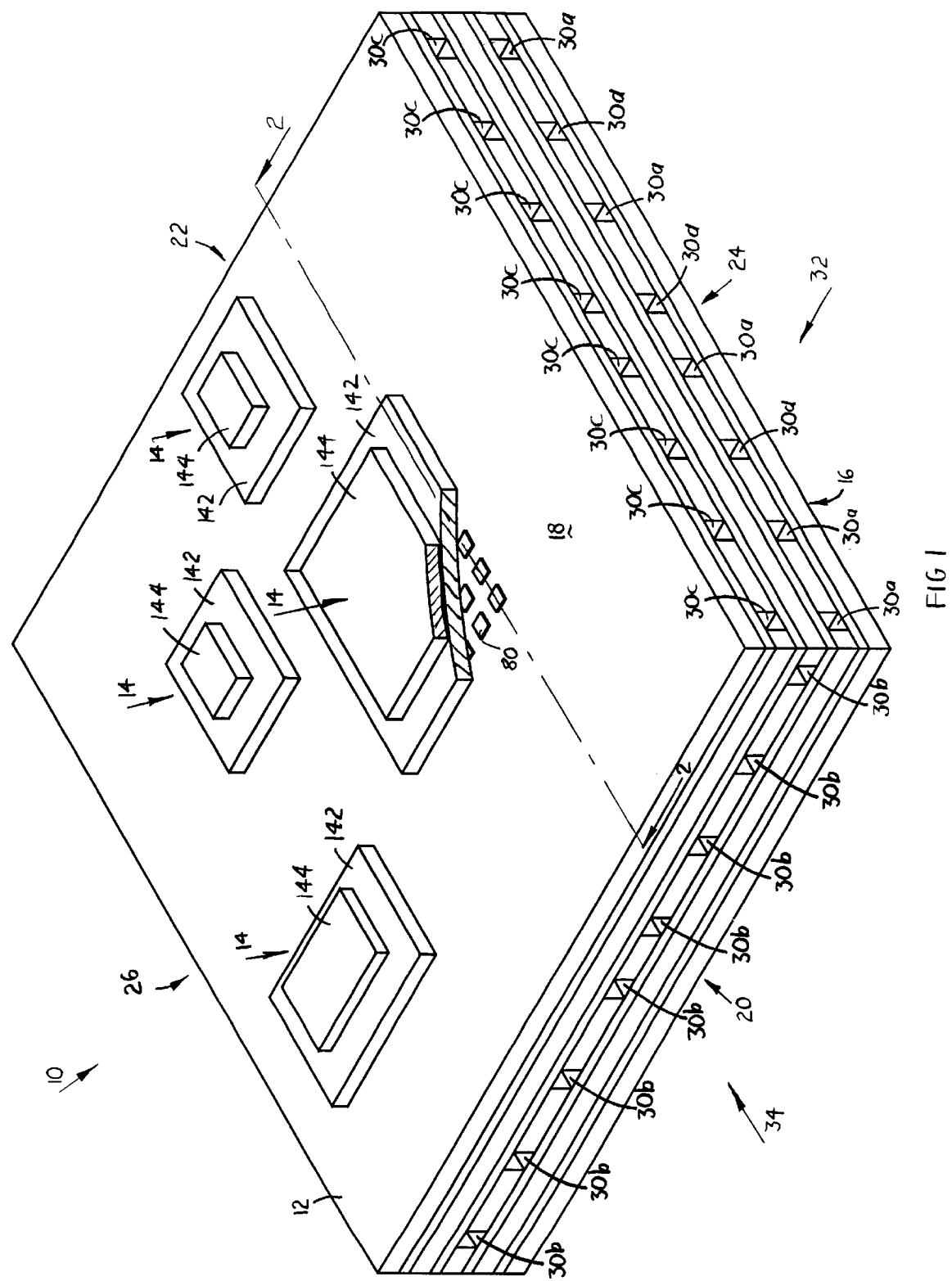
FIG. 1 is a perspective view of an electronic assembly according to one embodiment of the invention.

FIG. 1 of the accompanying drawings illustrates an electronic assembly 10 according to an embodiment of the invention, including an electronic substrate in the form of a computer motherboard 12, and a number of semiconductor assemblies 14 mounted to the motherboard 12.

The motherboard 12 has lower and upper opposing major surfaces 16 and 18 respectively, two opposing side surfaces 20 and 22 respectively, and two opposing end surfaces 24 and 26 respectively. Each side surface or end surface 20, 22, 24, or 26 extends from a respective edge of the lower surface 16 to a respective edge of the upper surface 18.

A plurality of cooling openings 30 are formed in the motherboard 12. Each cooling opening 30 extends parallel to the lower surface 16 and the upper surface 18 in a plane in which the motherboard 12 extends. The cooling openings 30 include a first plurality of cooling openings 30a, a second plurality of cooling openings 30b, and a third plurality of cooling openings 30c.

The first plurality of cooling openings 30a are located in a common plane and extend in a common direction 32 into the end surface 24, through the motherboard 12, and out of the end surface 26. The second plurality of cooling openings 30b are located in a common plane which is above the plane of the cooling openings 30a and extend in a common direction 34 into the side surface 20, through the motherboard 12 and out of the side surface 22. The third plurality of cooling openings 30c are located in a common plane above the plane of the cooling openings 30b and extend in the direction 32 into the end surface 24, through the motherboard 12 and out of the end surface 26.

Figure 2:
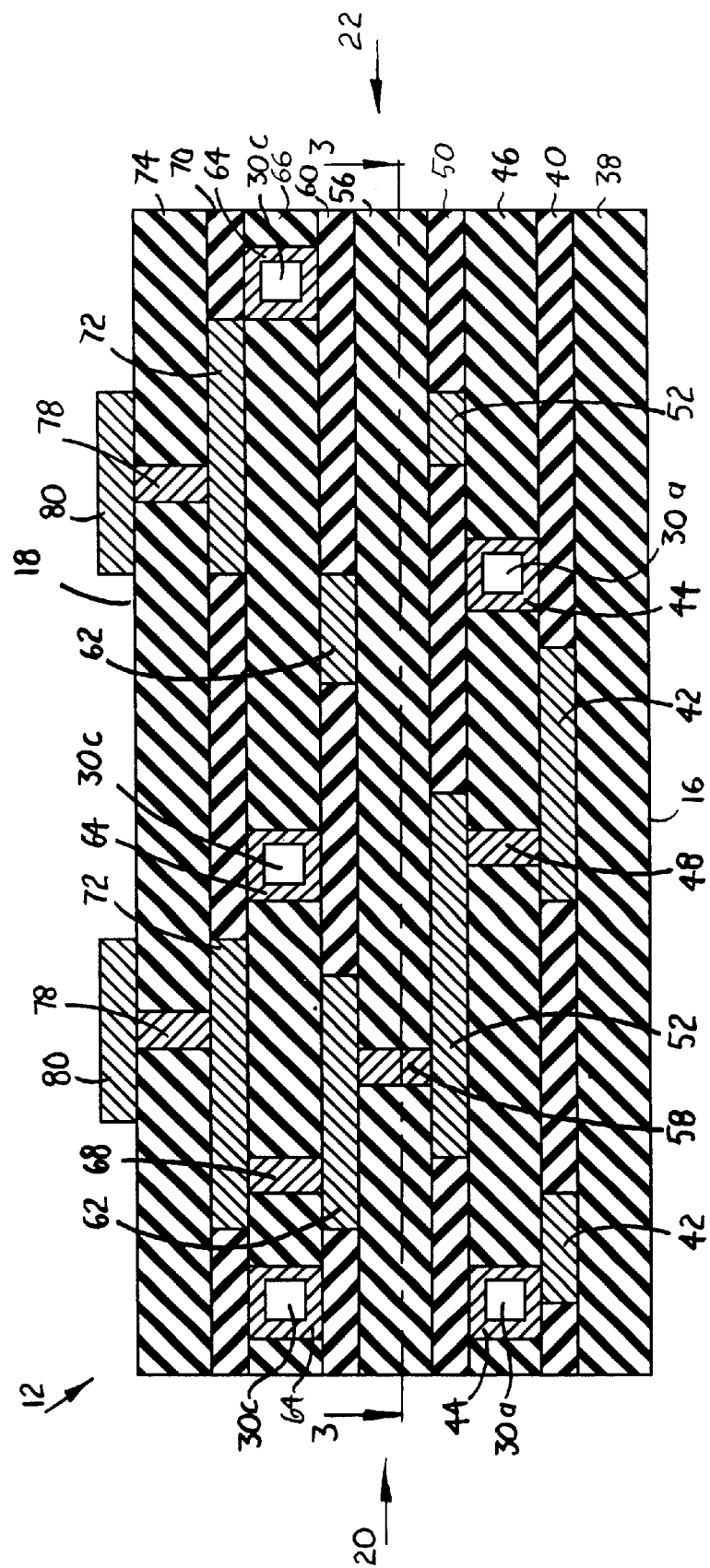
FIG. 2 is a cross-sectional view on 2—2 in FIG. 1 of a motherboard forming part of the electronic assembly.

FIG. 2 is a cross sectional view on 2—2 in FIG. 2 of the motherboard 12. A base layer 38 of insulating material is provided onto which a dielectric material layer 40 is formed. Metal lines 42 are formed within the dielectric material layer 40. Capillaries 44 are located on a plane or surface formed by of the dielectric material layer 40 and metal lines 42. Each capillary 44 defines a respective one of the cooling openings 30a. Each cooling opening 30a is entirely bounded by a respective capillary 44. The capillaries 44 are preferably made of a metal or other thermally conductive material. An interlayer dielectric material layer 46 is formed next to the capillaries 44. Metal vias 48 are formed into the interlayer dielectric material layer 46. Each via 48 has a lower end which is in contact with one of the metal lines 42.

A dielectric material layer 50 is formed on a surface provided by the interlayer dielectric material 46, the capillaries 44, and upper ends of the vias 48. Metal lines 52 are formed in the dielectric material layer 50. A respective metal line 52 may have a portion contacting an upper end of a respective via 48. More capillaries (not shown) are then located on a surface provided by the dielectric material layer 50 and the metal lines 52. These capillaries extend at right angles to the capillaries 44 and each one of these capillaries has a respective one of the cooling openings 30b shown in FIG. 1. An interlayer dielectric material 56 is formed next to these capillaries and vias 58 are formed in the interlayer dielectric material layer 56. A respective one of the vias 58 has a lower portion contacting a respective one of the metal lines 52.

A dielectric material layer 60 is then formed on a surface provided by the interlayer dielectric material layer 56, upper ends of the vias 58, and the capillaries located within the interlayer dielectric material layer 56. Metal lines 62 are then formed within the dielectric material layer 60. A respective metal line 62 may have a respective portion contacting a respective upper end of a respective one of the vias 58. More capillaries 64 are then located on a surface provided by the dielectric material layer 60, and the metal lines 62. Each capillary 64 defines one of the cooling openings 30c and is the same as one of the capillaries 44 in all other respects. An interlayer dielectric material layer 66 is formed next to the capillaries 64 and metal vias 68 are formed into the interlayer dielectric material layer 66. Each via 68 may have a lower end contacting a portion of a respective one of the metal lines 62.

A dielectric material layer 70 is formed on a surface provided by the interlayer dielectric material layer 66, the capillaries 64, and upper ends of the vias 68. Metal lines 72 are formed within the dielectric material layer 70. A respective metal line 72 may have a portion contacting a respective upper end of a respective one of the vias 68.

A top layer 74 of dielectric material is formed on a surface provided by the dielectric material layer 70 and the metal lines 72. Metal vias 78 are formed in the top layer 74. Each via 78 has a lower end contacting a respective one of the metal lines 72. Contact pads 80 are then formed on a surface of the top layer 74 and upper ends of the vias 78. Each contact pad 80 has a portion contacting a respective one of the vias 78. Respective ones of the contact pads 80 can be electrically connected to one another contact pad 80 through a series of vias and metal lines in the motherboard 12.

Figure 3:
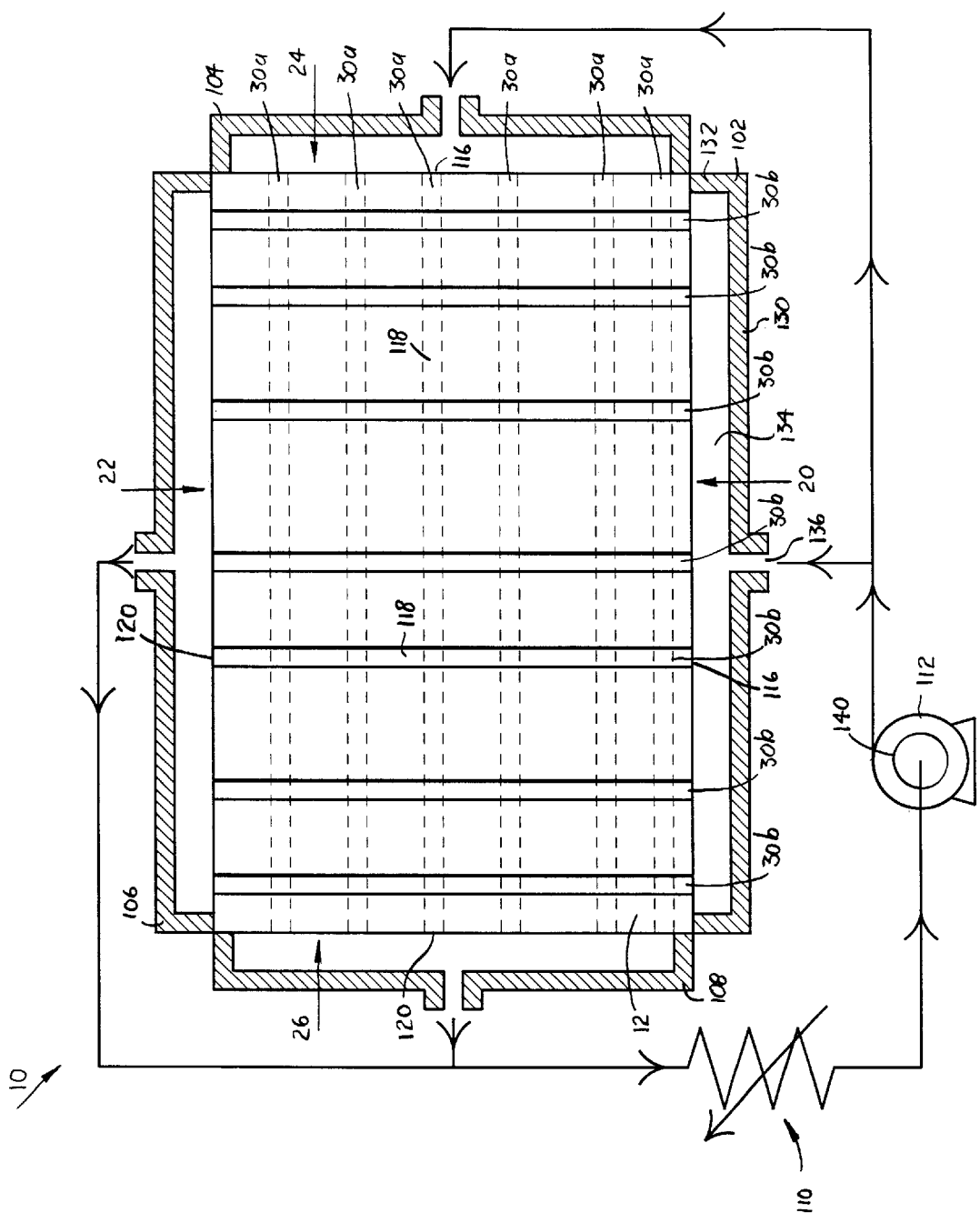
FIG. 3 is a cross-sectional plan view on 3—3 of the motherboard in FIG. 2, further illustrating other components of the electronic assembly.

FIG. 3 is a view on 3—3 in FIG. 2 of the motherboard 12, further illustrating other components of the electronic assembly 10 including an inlet manifold 102, and inlet manifold 104, an outlet manifold 106, an outlet manifold 108, a radiator 110, and a pump 112. Each opening 30*a*, 30*b*, or 30*c* has a respective inlet 116, a respective section 118 extending through the motherboard 12, and a respective outlet 120. An inlet 116 of a cooling opening 30*a* is located in the end surface 24 and an outlet 120 of a cooling opening 30*a* is located in the end surface 26. An inlet 116 of an opening 30*b* is located in the side surface 20 and an outlet 120 of a cooling opening 30*b* is located in the side surface 22.

The inlet manifold 102 includes a plate portion 130 and flanges 132 extending from edges of the plate portion 130. The plate portion 130 and the flanges 132 together define a recessed shape. The inlet manifold 130 is secured against the side surface 20 so that the side surface 20, the flanges 132 and the plate portion 130 together define an enclosed cavity 134. A port 136 is provided through the plate portion 130.

The inlet manifold 104 and the outlet manifolds 106 and 108 are of similar construction to the inlet manifold 102 and are located over the end surface 24, the side surface 22, and the end surface 26, respectively.

An outlet of the pump 112 is connected to the port 136 of the inlet manifold 132 and a port of the inlet manifold 104. Ports of the outlet manifolds 106 and 108 are connected to the radiator 110. The radiator 110 is connected to an inlet of the pump 112. The electric motor 140 is connected to a shaft (not shown) of the pump 112. Operation of the electric motor 140 rotates a shaft of the pump 112 so that the pump draws a fluid into its inlet and expels the fluid out of its outlet.

Referring again to FIG. 1, each semiconductor assembly 14 includes a respective package substrate 142 and a respective semiconductor die 144 mounted to the package substrate 142. Each semiconductor die 144 is thereby thermally connected to a respective package substrate 142. Each semiconductor die 144 also has an integrated electronic circuit manufactured therein according to conventional methods. The electronic circuit is connected to contacts (not shown) on the package substrate 142. Vias and metal lines, similar to the vias and metal lines of the motherboard 12 are formed in the package substrate 142. Electric contacts (not shown) are formed on a lower surface of each package substrate 142. A respective solder ball (not shown) is formed on each electric contact. The solder balls are then located against the contact pads 80 on the motherboard 12 and, according to conventional methods, heated, and allowed to cool, thereby mounting the package substrate 142 to the motherboard 12. The package substrate 142 is so thermally, structurally and electrically connected to the motherboard 12.

In use, signals are transmitted through the metal lines as shown in FIG. 2 of the motherboard 12. The signals transmit through the contact pads 80, and through metal lines and vias in the package substrate 142 to the electronic circuit formed in the semiconductor die 144. Return signals are transmitted via similar paths from the electronic circuit formed in the semiconductor die 144. Metal lines in the motherboard 12 can also transmit signals from one integrated circuit formed in one semiconductor die 144 another integrated circuit formed in another semiconductor die 144.

The transmission to and from the electronic circuits in the semiconductor dies 144 results in heat being generated on the semiconductor dies 144. The heat is transferred from a respective semiconductor die 144 to the package substrate 142 of the respective semiconductor assembly 14. The heat then transfers from the respective package substrate 142 into the motherboard 12. Referring to FIG. 2, the heat transfers through the motherboard to the capillaries 64, the capillaries in the interlayer dielectric material 56, and the capillaries 44. Because the capillaries are made of thermally conductive material, the heat transfers therethrough to the cooling openings 30*a*, 30*b*, and 30*c*. Referring to FIG. 3, a cooling liquid is pumped by the pump 112 through the port 136 into the cavity 134. The inlets 116 of the cooling openings 30*b* are in flow communication with the cavity 134 and one another so that the liquid flows into the inlet openings 116 of the cooling openings 30*b*. The liquid then flows through a respective section 118 of a respective cooling opening 30*b* and leaves the motherboard 12 through a respective outlet 120 of the respective cooling opening 30*b*. The liquid flowing through the openings 30*b* then accumulates within a cavity defined by the side surface 22 and the outlet manifold 106, from where the liquid flows through a port of the manifold 106 to the radiator 110.

The pump 112 also provides liquid through a port of the inlet manifold 104 into a cavity provided between the inlet manifold 104 and the end surface 24. The liquid flows from this cavity through a respective inlet 116 of a respective opening 30*a* and a respective opening 30*c*. The liquid then flows through a respective section 118 of a respective opening 30*a* or 30*c* and leaves the motherboard 12 through a respective outlet 120 of a respective opening 30*a* or 30*c*. The liquid flowing through the openings 30*a* and 30*c* then accumulates within a cavity defined between the end surface 26 and the outlet manifold 108, from where the liquid flows through a port of the manifold 108 to the radiator 110.

Heat is transferred from the motherboard 12 to the openings 30*a*, 30*b*, and 30*c* is convected from inner surfaces of the capillaries to the liquid flowing through the openings 30*a*, 30*b*, and 30*c*. The liquid is heated while flowing through the openings 30*a*, 30*b*, and 30*c* and, after leaving the manifolds 106 and 108, flows through the radiator 110. Heat is transferred from the liquid by the radiator 110 so that the liquid is then cooled to a temperature which is sufficiently low to maintain the motherboard 12 at a required temperature. The liquid then flows from the radiator 110 into an inlet of the pump whereafter the liquid is again circulated.

An advantage of using a liquid as a cooling fluid is because more heat can be transferred to a liquid then to a gas. A disadvantage of using a liquid, however, is that it has to be confined and be recirculated.

FIG. 4 illustrates an electronic assembly 10*a* according to an alternative embodiment of the invention wherein air is used as a fluid for purposes of cooling. A fan assembly 150 is provided instead of a pump. The fan assembly 150 has a housing 152 having an inlet 160 and an outlet 162, and a fan 164 mounted in the housing 152. The fan 164 is connected to an electric motor 140*a*. Operation of the electric motor 140*a* rotates the fan 164 so that the fan 164 draws air from a surrounding atmosphere through the inlet 160 into the housing 152. The air is then expelled through the outlet 162 and flows from the outlet 162 through ports into manifolds 104*a* and 106*a*. The air then flows from within the manifolds 104*a* and 106*a* through openings 30*a* and 30*b*, whereafter the air exits the motherboard 12*a* into a surrounding atmosphere. The embodiment of FIG. 4 is the same as the embodiment of FIG. 3 in all other respects.

Although a fan assembly 150 is shown in FIG. 4 it should be understood that the fan assembly 150 can be replaced with another fluid actuation machine such as a compressor and the electronic assembly 10a will function in a similar manner.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly comprising:
    an electronic substrate having upper and lower surfaces, a plurality of metal lines therein to transmit signals, a plurality of contact pads on the upper surface thereof and electrically connected to the conductive lines, and a cooling opening therethrough, the cooling opening having an inlet to allow fluid into the electronic substrate, a section in the electronic substrate through which the fluid flows from the inlet, and an outlet from which the fluid flows from the section out of the electronic substrate; and
    a semiconductor assembly mounted on top of the electronic substrate, the semiconductor assembly having upper and lower surfaces, a semiconductor die having an electronic circuit, and a plurality of electric contacts on the lower surface thereof, the electronic circuit being connected through the electric contacts and the contact pads to the metal lines so that signals are transmitted between the electronic circuit and the metal lines, operation of the electronic circuit causing heating of the semiconductor die, heat being transferred from the semiconductor die through the contact pads and the electric contacts to the electronic substrate from where heat is transferred to the fluid flowing through the section.

2. The electronic assembly of claim 1 wherein the section extends substantially in a plane in which the electronic substrate extends.

3. The electronic assembly of claim 1 wherein the electronic substrate has a plurality of said cooling openings therethrough.

4. The electronic assembly of claim 3 wherein the cooling openings extend substantially in a common direction.

5. The electronic assembly of claim 3 wherein a first plurality of the openings are located in one plane and a second plurality of the openings are located in another plane that is different from the plane of the first plurality of openings.

6. The electronic assembly of claim 5 wherein the first and second pluralities of openings extend in substantially a common direction.

7. The electronic assembly of claim 5 wherein the first plurality of openings extend in one direction and the second plurality of openings extend in another direction transverse to the first plurality of openings.

8. The electronic assembly of claim 7 wherein a third plurality of the openings are located in another plane that is different from the plane of the first plurality of openings and different from the plane of the second plurality of openings.

9. The electronic assembly of claim 8 wherein the plane of the second plurality of openings is located between the plane of the first plurality of openings and the plane of the third plurality of openings, and the first plurality of openings and the third plurality of openings extend substantially in a common direction.

10. The electronic assembly of claim 3 further comprising a manifold that connects the openings to one another.

11. The electronic assembly of claim 1 further comprising a fluid actuation machine, and an electric motor, the electric motor being coupled to the machine so that operation of the electric motor drives the machine and the machine moves the fluid, the machine having an outlet connected to the inlet of the cooling opening so that the fluid can flow from the machine into the cooling opening.

12. The electronic assembly of claim 11 wherein the machine is one of a fan, a pump and a compressor.

13. The electronic assembly of claim 11 further comprising an inlet manifold connected to the outlet of the machine so that the fluid flows from the machine into the manifold, the electronic substrate having a plurality of said cooling openings therethrough, a respective inlet of each cooling opening being in flow communication with the manifold so that the fluid flows from the manifold into each cooling opening.

14. The electronic assembly of claim 13 further comprising an outlet manifold in flow communication with a respective outlet of each cooling opening so that the fluid can flow from the cooling openings into the outlet manifold, the machine having an inlet connected to the outlet manifold so that the fluid can flow from the outlet manifold into the machine.

15. The electronic assembly of claim 14 further comprising a radiator connected in line between the outlet manifold and the inlet manifold so that the fluid is cooled by the radiator after leaving the outlet manifold and before entering the inlet manifold.

16. The electronic assembly of claim 14 wherein the machine is a pump.

17. The electronic assembly of claim 1 further comprising a package substrate, the die being mounted to the package substrate and the package substrate being mounted to the electronic substrate.

18. An electronic assembly comprising:
    a fluid actuation machine;
    an electric motor coupled to the machine so that operation of the electric motor drives the machine and the machine moves fluid through an outlet thereof;
    a manifold in flow communication with the outlet of the machine so that the fluid flows from the outlet of the machine into the manifold;
    an electronic substrate having upper and lower surfaces, a plurality of cooling openings therein, each cooling opening being in flow communication with the manifold so that the fluid flows from the manifold into each cooling opening, each cooling opening having a section in the substrate through which the fluid flows, whereafter the fluid flows out of the substrate, the electronic substrate further having a plurality of metal lines therein to transmit signals, and a plurality of contact pads on the lower surface thereof and electrically connected to the metal lines; and
    a semiconductor assembly mounted on top of the electronic substrate, the semiconductor assembly having upper and lower surfaces, a semiconductor die having an electronic circuit, and a plurality of electric contacts on the lower surface thereof, the electronic circuit being connected through the electronic contacts and the contact pads to the metal lines so that signals are transmitted between the electronic circuit and the metal lines, operation of the electronic circuit causing heating of the semiconductor die, heat being transferred from the semiconductor die through the contact pads and the electric contacts to the electronic substrate from where heat is transferred to the fluid flowing through each section.

19. The electronic assembly of claim 18 wherein the manifold is separately manufactured from the electronic substrate and mounted to the electronic substrate.

20. An electronic assembly comprising:

an electronic substrate having two opposing major surfaces two opposing side surfaces, each extending between the major surfaces, and two opposing end surfaces, each extending between the major surfaces, a plurality of metal lines to transmit signals, a first plurality of cooling openings located in one plane in the substrate and extending from the one side surface towards the other side surface and being open at opposing ends so that a fluid can enter into one end thereof and exit from an opposing end thereof, and a second plurality of cooling openings in one plane in the substrate being different to the plane of the first plurality of cooling openings, each extending from the one end surface towards the other end surface and being open at opposing ends so that a fluid can enter into one end thereof and exit from an opposing end thereof wherein each one of the first plurality of cooling openings has an inlet into one of the side surfaces and an outlet through the other side surface, and each one of the second plurality of cooling openings has an inlet into one of the end surfaces and an outlet through the other end surface; and a semiconductor die mounted to the electronic substrate, the die having an electronic circuit connected to the metal lines so that signals are transmitted between the electronic circuit and the metal lines, operation of the electronic circuit causing heating of the die, heat being transferred from the die to the electronic substrate from where heat is transferred to the fluid flowing through the first plurality of cooling openings and the fluid flowing through the second plurality of cooling openings.

* * * * *